(12) United States Patent
Hamaguchi et al.

(10) Patent No.: US 9,337,092 B2
(45) Date of Patent: May 10, 2016

(54) METHOD OF MANUFACTURING SEMICONDUCTOR DEVICE

(71) Applicant: ULVAC, INC., Chigasaki-shi (JP)

(72) Inventors: Junichi Hamaguchi, Susono (JP); Shuji Kodaira, Susono (JP); Yuta Sakamoto, Susono (JP); Akifumi Sano, Susono (JP); Koukichi Kamada, Susono (JP); Yoshiyuki Kadokura, Susono (JP); Joji Hiroishi, Susono (JP); Yukinobu Numata, Susono (JP); Koji Suzuki, Susono (JP)

(73) Assignee: ULVAC, INC., Chigasaki-Shi (JP)

( * ) Notice: Subject to any disclaimer, the term of this patent is extended or adjusted under 35 U.S.C. 154(b) by 5 days.

(21) Appl. No.: 14/347,779

(22) PCT Filed: Sep. 20, 2012

(86) PCT No.: PCT/JP2012/074075
§ 371 (c)(1),
(2) Date: Mar. 27, 2014

(87) PCT Pub. No.: WO2013/047323
PCT Pub. Date: Apr. 4, 2013

(65) Prior Publication Data
US 2015/0221552 A1 Aug. 6, 2015

(30) Foreign Application Priority Data
Sep. 30, 2011 (JP) .................................. 2011-215847

(51) Int. Cl.
*H01L 21/4763* (2006.01)
*H01L 21/768* (2006.01)
(Continued)

(52) U.S. Cl.
CPC ........ *H01L 21/76882* (2013.01); *C23C 14/024* (2013.01); *C23C 14/046* (2013.01);
(Continued)

(58) Field of Classification Search
CPC ............ H01L 21/76847; H01L 23/481; H01L 21/76871; H01L 23/4827; H01L 21/76864; H01L 21/76873; H01L 21/76877; H01L 21/76882; H01L 2924/0002; H01L 21/76879; H01L 21/76841; H01L 23/53238
USPC ................. 438/618–624, 637–638, 672–673, 438/627–629
See application file for complete search history.

(56) References Cited

U.S. PATENT DOCUMENTS 5,654,232 A * 8/1997 Gardner ........................ 438/661
6,077,780 A * 6/2000 Dubin .......................... 438/687
(Continued)

FOREIGN PATENT DOCUMENTS

CN 101399220 4/2009
JP 6-103681 12/1994
(Continued)

OTHER PUBLICATIONS
Office Action from corresponding Taiwanese Application No. 101135371 dated Jul. 17, 2014. English translation attached.
(Continued)

*Primary Examiner* — Dung Le
(74) *Attorney, Agent, or Firm* — Grossman, Tucker, Perreault & Pfleger, PLLC (57) ABSTRACT

A method of manufacturing a semiconductor device includes a groove portion formation process of forming a groove portion in a base body, a bather layer formation process of forming a barrier layer covering at least the inner wall surface of the groove portion, a seed layer formation process of forming a seed layer covering the barrier layer, and a seed layer melting process of causing the seed layer to be melted using the reflow method. The seed layer is made of Cu.

3 Claims, 4 Drawing Sheets

(51) Int. Cl.
*H01L 23/532* (2006.01)
*H01L 21/285* (2006.01)
*C23C 14/02* (2006.01)
*C23C 14/04* (2006.01)
*C23C 14/16* (2006.01)
*C23C 14/14* (2006.01)
*C23C 14/34* (2006.01)

(52) U.S. Cl.
CPC ............... *C23C 14/14* (2013.01); *C23C 14/16* (2013.01); *C23C 14/34* (2013.01); *H01L 21/2855* (2013.01); *H01L 21/76841* (2013.01); *H01L 21/76871* (2013.01); *H01L 21/76879* (2013.01); *H01L 23/53238* (2013.01); *H01L 2924/0002* (2013.01)

(56) References Cited

U.S. PATENT DOCUMENTS

| | | | |
|---|---|---|---|
| 6,184,137 B1 * | 2/2001 | Ding et al. | 438/687 |
| 2003/0139033 A1 | 7/2003 | Gardner | |
| 2006/0216930 A1 | 9/2006 | Feng et al. | |
| 2009/0194875 A1 * | 8/2009 | Yang et al. | 257/751 |
| 2010/0240174 A1 * | 9/2010 | Yu et al. | 438/107 |
| 2013/0119547 A1 * | 5/2013 | Kim et al. | 257/751 |
| 2014/0021581 A1 * | 1/2014 | Yang et al. | 257/530 |

FOREIGN PATENT DOCUMENTS

| | | |
|---|---|---|
| JP | 8-264535 | 10/1996 |
| JP | 8-316233 | 11/1996 |
| JP | 10-74760 | 3/1998 |
| JP | 2002-75994 | 3/2002 |
| JP | 2008-71850 | 3/2008 |
| KR | 100259357 | 6/2000 |

OTHER PUBLICATIONS

International Search Report from corresponding PCT Application No. PCT/JP2012/074075 dated Dec. 11, 2012. English translation attached.

Office Action from corresponding Chinese Application No. 201280028713.8 dated Jul. 2, 2015. English translation attached.

* cited by examiner

The embodiments are intended for better understanding of the spirit of the invention by taking an example, and as long as not particularly specified, the embodiments are not intended to limit the invention. In addition, drawings used in the following description can be shown, for convenience, by enlarging a portion serving as a main portion in order to make the feature of the invention easy to understand, and a dimensional ratio of each component and the like is not limited to be the same as the actual object.

(Semiconductor Device)

Figure 1:
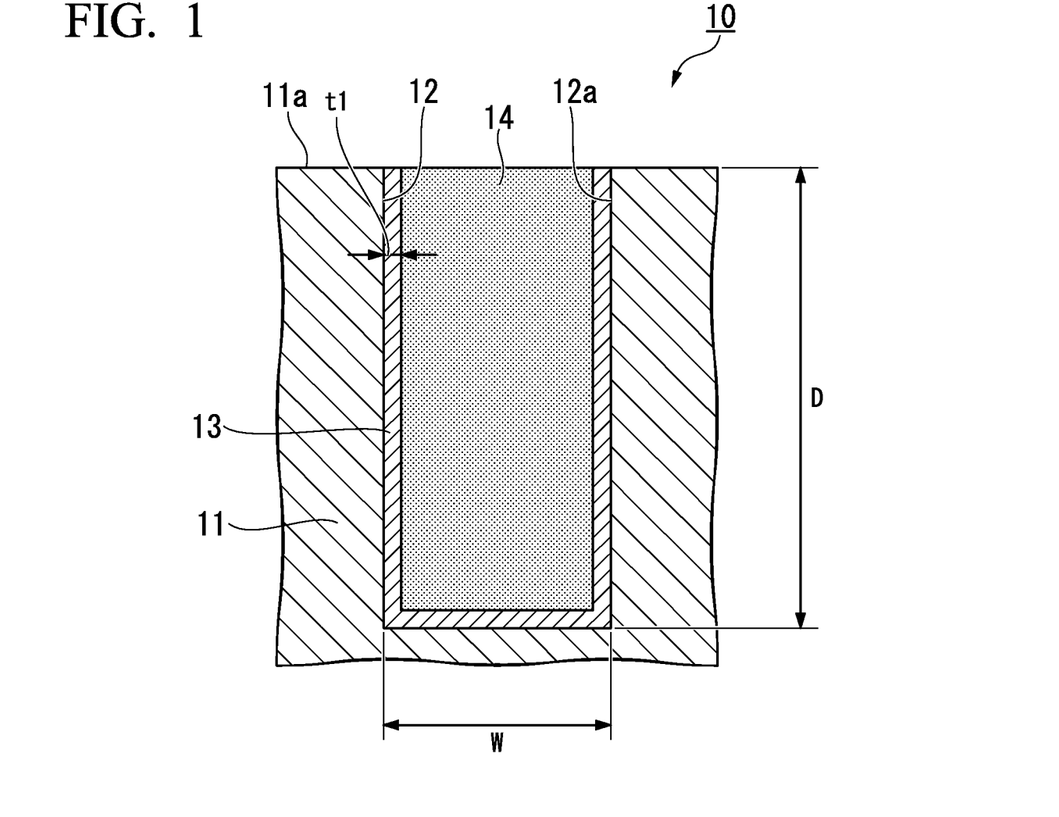

FIG. 1 is an enlarged sectional diagram of a main portion which shows a semiconductor device according to an embodiment of the invention.

A semiconductor device 10 includes a base body 11. The base body 11 is configured to have an insulating substrate, for example, a glass substrate, a resin substrate, and the like. For example, a semiconductor element and the like may be formed in a portion of the base body 11.

On one surface 11a of the base body 11, a groove portion (trench) 12 is formed. For example, the groove portion 12 is made of a groove which is formed in the thickness direction of the base body 11 from one surface 11a of the base body 11, and whose width is thin, deep, and fine. The width W of the bottom of the groove portion 12 is formed to be, for example, about 20 to 50 nm. In addition, the depth D of the groove portion 12 is formed to be, for example, about 80 to 200 nm. In the inner region of the groove portion 12, for example, a conductor which configures circuit wiring of the semiconductor element is formed.

In the groove portion 12, a barrier layer (barrier metal) 13 is formed to cover the inner wall surface 12a. The barrier layer 13 is configured of Ta (tantalum) nitride, Ta silicide, Ta carbide, Ti (titanium) nitride, Ti silicide, Ti carbide, W (tungsten) nitride, W silicide, W carbide, Ru (ruthenium), Ru oxide, V (vanadium) oxide, Co (cobalt) oxide, Nb (niobium) oxide, and the like.

The barrier layer (barrier metal) 13 is formed to have the thickness t1 of about 1 to 3 nm, for example.

Further, in the inner region of the barrier layer (barrier metal) 13 in the groove portion 12, a conductor 14 made of a conductive material is formed. The conductor 14 is configured of Cu (copper). The conductor 14 forms the seed layer in the inner region of the barrier layer (barrier metal) 13 and embeds the groove portion 12 by melting (reflowing) the seed layer.

For example, the conductor 14 is circuit wiring of the semiconductor element formed in the base body 11.

According to the semiconductor device 10 of such a configuration, by forming the seed layer made of Cu in the inner region of the barrier layer (barrier metal) 13, and melting (reflowing) the seed layer to form the conductor 14, a conductive material is embedded in the groove portion 12 without a gap at the time of forming the conductor 14. Accordingly, it is possible to realize the semiconductor device 10 including the conductor (circuit wiring) 14 which has uniform electrical resistance, no possibility of disconnection and the like, and is made of Cu.

(Method of Manufacturing Semiconductor Device)

Figure 2:
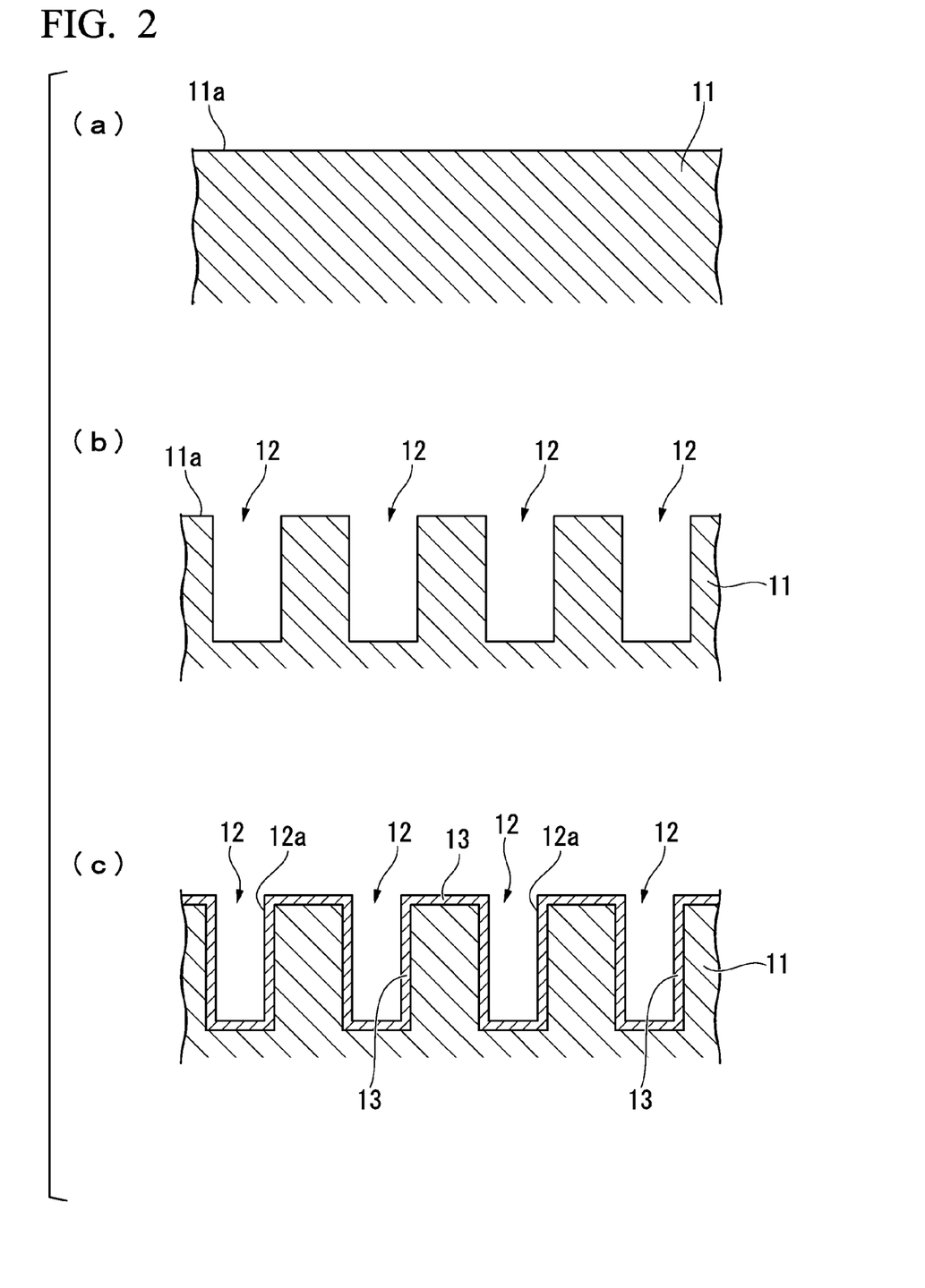
Figure 3:
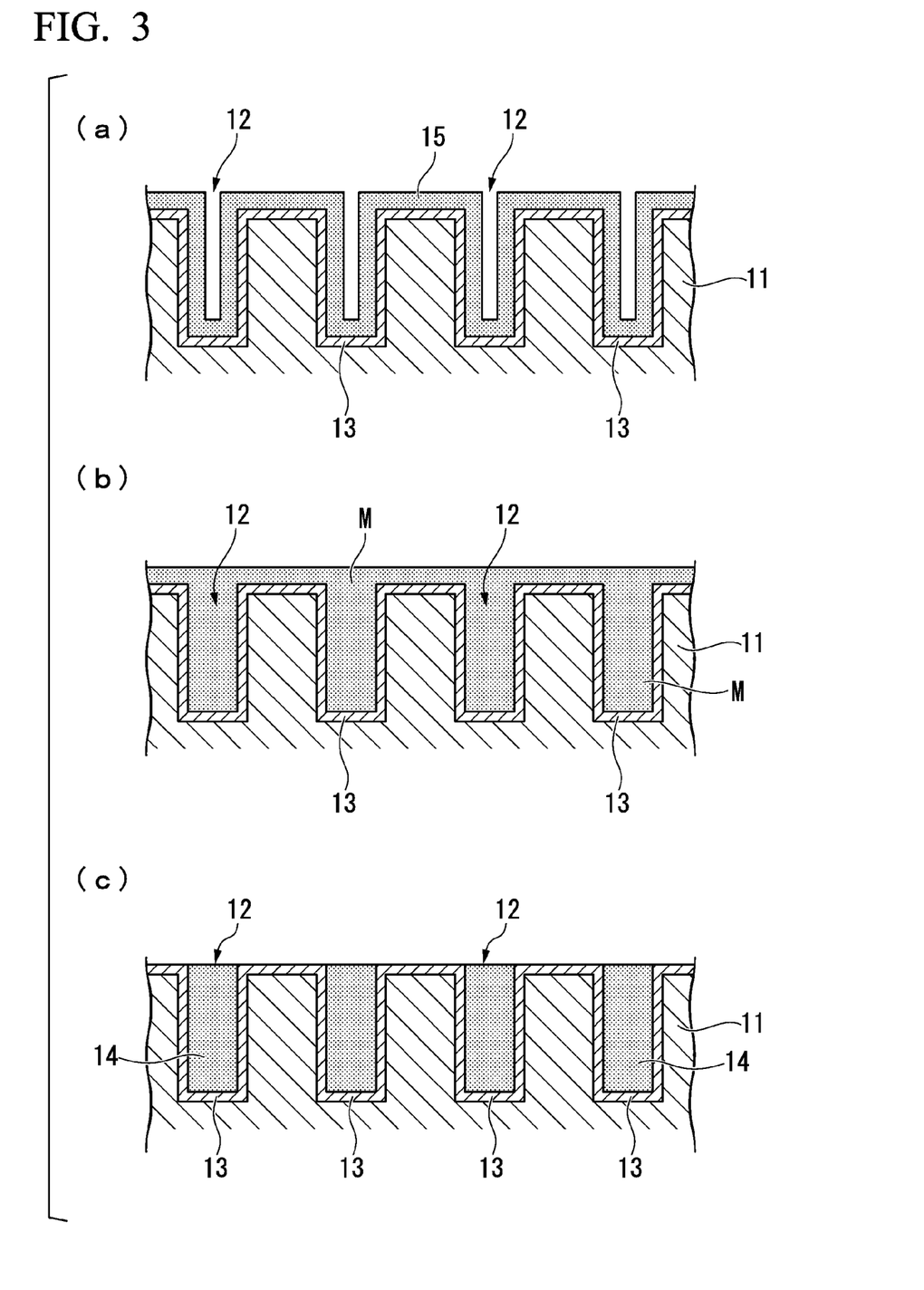

FIGS. 2 and 3 are enlarged sectional diagrams of a main portion which show a method of manufacturing the semiconductor device in a stepwise way according to an embodiment of the invention.

When manufacturing the semiconductor device according to an embodiment of the invention, first, the base body 11 is prepared (refer to FIG. 2(a)). An insulating substrate and a semiconductor substrate are used as the base body 11. The insulating substrate includes, for example, the glass substrate and the resin substrate. In addition, the semiconductor substrate includes, for example, a silicon wafer, a SiC wafer, and the like. In the base body 11, for example, the semiconductor element (not shown) is formed in advance.

Next, the groove portion 12 with a predetermined depth is formed on one surface 11a of the base body 11 (refer to FIG. 2(b): groove portion formation process). The groove portion 12 is formed so as to be in a pattern modeled after the circuit wiring of the semiconductor element. As a method of forming the groove portion 12 on one surface 11a of the base body 11, for example, etching using photolithography and a process using laser light can be used.

Next, on one surface 11a of the base body 11 including the inner wall surface 12a of the groove portion 12, the barrier layer (barrier metal) 13 with a predetermined thickness is formed (refer to FIG. 2(c): barrier layer formation process). The barrier layer (barrier metal) 13 is formed using, for example, a material including at least one of Ta, Ti, W, Ru, V, Co, and Nb. The formation of the barrier layer 13 is preferably performed using, for example, a sputtering method and a CVD method. In addition, the barrier layer (barrier metal) 13 is formed to have the thickness t1 of about 1 to 3 nm, for example.

Figure 4:
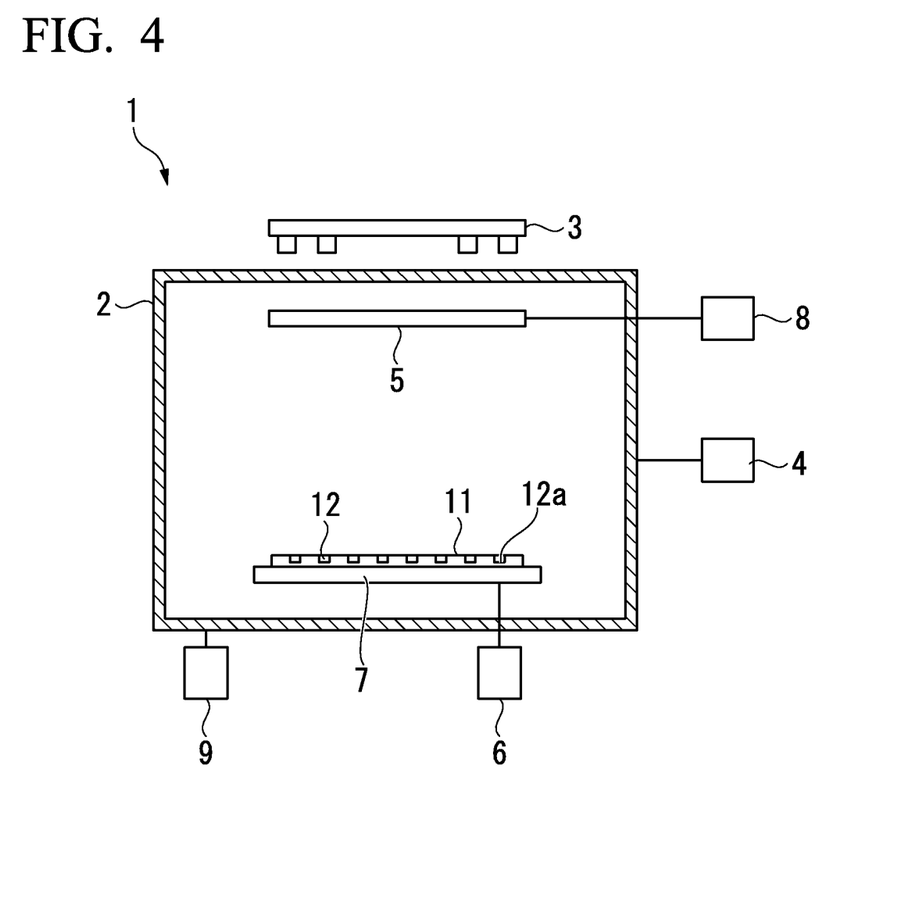

FIG. 4 shows an example of the sputtering apparatus (deposition apparatus) used in the formation of the barrier layer.

The sputtering apparatus (deposition apparatus) 1 includes a vacuum chamber 2, and a substrate holder 7 and a target 5 which are disposed in the vacuum chamber 2, respectively.

A vacuum exhaust system 9 and a gas supply system 4 are connected to the vacuum chamber 2, and by vacuum exhausting the inside of the vacuum chamber 2 and introducing a sputtering gas and a reaction gas containing nitrogen or oxygen in the chemical structure from the gas supply system 4 while vacuum exhausting (for example, when the reaction gas is oxygen, a rate of flow is from 0.1 to 5 sccm.), a deposition atmosphere which is lower than atmospheric pressure is formed in the vacuum chamber 2 (for example, a total pressure is from $10^{-4}$ Pa to $10^{-1}$ Pa).

Then, one surface 11a side where the groove portion 12 is formed on the base body 11 is held by the substrate holder 7 in a state towards the target 5. A sputtering power supply 8 and a bias power supply 6 are disposed outside the vacuum chamber 2, and the target 5 is connected to the sputtering power supply 8 and the substrate holder 7 is connected to the bias power supply 6, respectively.

When magnetic field formation means 3 is disposed outside the vacuum chamber 2, the vacuum chamber 2 is placed on a ground potential, a negative voltage is applied to the target 5 while holding the deposition atmosphere in the vacuum chamber 2, and the target 5 is magnetron-sputtered. The target 5 has a formation material of the barrier layer (barrier metal) 13 as a principal component.

Then, when the target 5 is magnetron-sputtered, the formation material of the barrier layer 13 is released as sputtered particles.

The released sputtered particles and a reaction gas are incident on one surface 11a of the base body 11 where the groove portion 12 is formed, and the barrier layer 13 is formed to cover one surface 11a of the base body 11 including the inner wall surface 12a of the groove portion 12.

Next, the seed layer 15 is formed to cover the barrier layer 13 (refer to FIG. 3(a): seed layer formation process). The seed layer 15 is reflowed in the next process to be a conductive material embedded in the groove portion 12. The seed layer 15 is configured of Cu. The seed layer 15 is formed using the sputtering method in the same manner as the barrier layer 13 described above. The seed layer 15 is formed to have a thickness of about 15 to 55 nm, for example.

A method of forming the seed layer 15 using the sputtering apparatus (deposition apparatus) 1 will be described.

First, in a state where the base body 11 is disposed on the substrate holder 7, by vacuum exhausting the inside of the vacuum chamber 2 by the vacuum exhaust system 9 and introducing a sputtering gas and a reaction gas including nitrogen or oxygen in the chemical structure (for example, when the reaction gas is oxygen, the flow rate is from 0.1 to 5 sccm) from the gas supply system 4 while vacuum exhausting, the deposition atmosphere which is lower than atmospheric pressure is formed in the vacuum chamber 2 (for example, a total pressure is from $10^{-4}$ to $10^{-1}$ Pa).

By introducing the sputtering gas, and running the sputtering power supply 8 after the inside of the vacuum chamber 2 is stabilized to a predetermined pressure (for example, a pressure of $4.0 \times 10^{-2}$ Pa), a negative voltage is applied to a cathode electrode (not shown), and thereby discharging is started and plasma is generated in the vicinity of the surface of the target 5 with the target 5 set as Cu.

Then, deposition by sputtering is performed for a predetermined time, and a copper thin film is formed to cover the barrier layer 13. Then, the base body 11 is taken out from the vacuum chamber 2.

Temperature adjusting means (not shown) is provided in the substrate holder 7 of the sputtering apparatus 1 described above, and when forming the copper thin film, the temperature adjusting means adjusts the temperature of the base body 11 to a predetermined temperature (for example, −20° C.).

The sputtering apparatus 1 can be configured to move and rotate the magnetic field forming means 3 in parallel to the surface of the target 5, and a region (an erosion region) sputtered on the surface of the target 5 can be formed at any position on the target.

Next, heating to the melting temperature or more of the seed layer 15 is performed on the base body 11 where the seed layer 15 is formed, and thereby reflow is performed (refer to FIG. 3(b): seed layer melting process). Accordingly, the seed layer 15 is melted and embedded in the inside of the groove portion 12, that is, the inner region of the barrier layer 13, using a conductive material M made of Cu.

The melting temperature of the seed layer 15 is set to a range of 100 to 400° C.

When the conductive material M made of Cu is not sufficiently filled in the inner region of the barrier layer 13, it is preferable to repeat the seed layer formation process and the seed layer melting process two or more times. Accordingly, it is possible to more reliably fill the conductive material M made of Cu in the inner region of the barrier layer 13.

Thereafter, the barrier layer 13 deposited on one surface 11a of the base body 11 excluding the groove portion 12, and the conductive material M are removed (refer to FIG. 3(c)). Accordingly, the conductor 14 embedding the groove portion 12, that is, circuit wiring, is formed for each groove portion 12.

EMBODIMENT

Hereinafter, the embodiment of the invention is more specifically described by experimental examples. However, the invention is not limited to the following experimental examples.

Experimental Example 1

A silicon substrate with a silicon oxide film, which has a thickness of 0.775 mm, is prepared as a base body.

Next, on one surface of the base body, a groove portion with a depth of 100 nm is formed by etching using photolithography.

Next, on one surface of the base body including the inner wall surface of the groove portion, a barrier layer made of Ta with a thickness of 3 nm is formed by the sputtering method.

Next, in order to cover the barrier layer, a seed layer with copper thin film with a thickness of 25 nm is formed by the sputtering method. When the copper thin film is formed, the temperature of the base body is adjusted to −20° C.

Next, by heating the base body having the seed layer formed thereon to 400° C. and melting the seed layer, the conductive material made of Cu is embedded in the groove portion, that is, in the inner region of the barrier layer.

After embedding the conductive material made of Cu in the inner region of the barrier layer, the filling rate of the groove portion of the base body (a rate of the groove portion filled with Cu, volume %) is examined using a scanning electron microscope (SEM).

A case where the filling rate is equal to or more than 90% is expressed as O, a case where the filling rate is equal to or more than 80% and less than 90% is expressed as Δ, and a case where the filling rate is less than 80% is expressed as X.

The result is shown in Table 1.

Experimental Example 2

Except that the seed layer made of Cu with a thickness of 35 nm is formed, in the same manner as the experimental example 1, the inside of the groove portion of the base body is filled with Cu.

In addition, in the same manner as the experimental example 1, the filling rate of the groove portion is examined.

The result is shown in Table 1.

Experimental Example 3

Except that a seed layer made of Cu with a thickness of 45 nm is formed, in the same manner as the experimental example 1, the inside of a groove portion of a base body is filled with Cu.

In addition, in the same manner as the experimental example 1, the filling rate of the groove portion is examined.

The result is shown in Table 1.

Experimental Example 4

Except that Cu is embedded in a groove portion by heating the base body having a seed layer formed thereon to 300° C., and melting the seed layer, in the same manner as the experimental example 1, the inside of the groove portion of the base body is filled with a conductor.

In addition, in the same manner as the experimental example 1, the filling rate of the groove portion is examined.

The result is shown in Table 1.

Experimental Example 5

Except that Cu is embedded in a groove portion by forming a seed layer made of Cu with a thickness of 35 nm, heating a base body having the seed layer formed thereon to 300° C., and melting the seed layer, in the same manner as the experimental example 1, the inside of the groove portion of the base body is filled with a conductor.

In addition, in the same manner as the experimental example 1, the filling rate of the groove portion is examined.

The result is shown in Table 1.

Experimental Example 6

Except that Cu is embedded in a groove portion by forming a seed layer made of Cu with a thickness of 45 nm, heating a base body having the seed layer formed thereon to 300° C., and melting the seed layer, in the same manner as the experimental example 1, the inside of the groove portion of the base body is filled with a conductor.

In addition, in the same manner as the experimental example 1, the filling rate of the groove portion is examined.

The result is shown in Table 1.

Experimental Example 7

Except that Cu is embedded in a groove portion by forming a seed layer made of Cu with a thickness of 55 nm, heating a base body having the seed layer formed thereon to 300° C., and melting the seed layer, in the same manner as the experimental example 1, the inside of the groove portion of the base body is filled with a conductor.

In addition, in the same manner as the experimental example 1, the filling rate of the groove portion is examined.

The result is shown in Table 1.

Experimental Example 8

Except that Cu is embedded in a groove portion by heating a base body having a seed layer formed thereon to 200° C., and melting the seed layer, in the same manner as the experimental example 1, the inside of the groove portion of the base body is filled with a conductor.

In addition, in the same manner as the experimental example 1, the filling rate of the groove portion is examined.

The result is shown in Table 1.

Experimental Example 9

Except that Cu is embedded in a groove portion by forming a seed layer made of Cu with a thickness of 35 nm, heating a base body having the seed layer formed thereon to 200° C., and melting the seed layer, in the same manner as the experimental example 1, the inside of the groove portion of the base body is filled with a conductor.

In addition, in the same manner as the experimental example 1, the filling rate of the groove portion is examined.

The result is shown in Table 1.

Experimental Example 10

Except that Cu is embedded in a groove portion by forming a seed layer made of Cu with a thickness of 45 nm, heating a base body having the seed layer formed thereon to 200° C., and melting the seed layer, in the same manner as the experimental example 1, the inside of the groove portion of the base body is filled with a conductor.

In addition, in the same manner as the experimental example 1, the filling rate of the groove portion is examined.

The result is shown in Table 1.

Experimental Example 11

A silicon substrate with a silicon oxide film, which has a thickness of 0.775 mm is prepared as a base body.

Next, on one surface of the base body, a groove portion with a depth of 100 nm is formed by etching using the photolithography.

Next, on one surface of the base body including the inner wall surface of the groove portion, the barrier layer made of Ta with a thickness of 3 nm is formed by the sputtering method.

Then, in order to cover the barrier layer, a copper thin film with a thickness of 25 nm is formed by the sputtering method. When forming the copper thin film, the temperature of the base body is adjusted to −20° C.

Then, by heating the base body having a seed layer formed thereon to 400° C. and melting the seed layer, a conductive material made of Cu is embedded in the inside of the groove portion, that is, the inner region of the barrier layer.

Again, the copper thin film is formed by the sputtering method in the inner region of the barrier layer. When the copper thin film is formed, the temperature of the base body is adjusted to −20° C.

Next, by heating the base body having the seed layer formed thereon to 400° C. and melting the seed layer, the conductive material made of Cu is embedded in the inside of the groove portion.

Thereafter, in the same manner as the experimental example 1, the filling rate of the groove portion is examined.

The result is shown in Table 2.

Experimental Example 12

Except that Cu is embedded in a groove portion by heating a base body having a seed layer formed thereon to 350° C., and melting the seed layer, in the same manner as the experimental example 11, the inside of the groove portion of the base body is filled with a conductor.

In addition, in the same manner as the experimental example 1, the filling rate of the groove portion is examined.

The result is shown in Table 2.

Experimental Example 13

Except that Cu is embedded in a groove portion by forming a seed layer made of Cu with a thickness of 35 nm, heating a base body having the seed layer formed thereon to 350° C., and melting the seed layer, in the same manner as the experimental example 11, the inside of the groove portion of the base body is filled with a conductor.

In addition, in the same manner as the experimental example 1, the filling rate of the groove portion is examined.

The result is shown in Table 2.

Experimental Example 14

Except that Cu is embedded in a groove portion by forming the seed layer made of Cu with a thickness of 40 nm, heating the base body having the seed layer formed thereon to 350° C., and melting the seed layer, in the same manner as the experimental example 11, the inside of the groove portion of the base body is filled with a conductor.

In addition, in the same manner as the experimental example 1, the filling rate of the groove portion is examined.

The result is shown in Table 2.

Experimental Example 15

Except that Cu is embedded in a groove portion by forming a seed layer made of Cu with a thickness of 15 nm, heating a base body having the seed layer formed thereon to 300° C., and melting the seed layer, in the same manner as the experimental example 11, the inside of the groove portion of the base body is filled with a conductor.

In addition, in the same manner as the experimental example 1, the filling rate of the groove portion is examined. The result is shown in Table 2.

Experimental Example 16

Except that Cu is embedded in a groove portion by heating a base body having a seed layer formed thereon to 300° C. and melting the seed layer, in the same manner as the experimental example 11, the inside of the groove portion of the base body is filled with a conductor.

In addition, in the same manner as the experimental example 1, the filling rate of the groove portion is examined. The result is shown in Table 2.

Experimental Example 17

Except that Cu is embedded in a groove portion by forming a seed layer made of Cu with a thickness of 35 nm, heating a base body having the seed layer formed thereon to 300° C., and melting the seed layer, in the same manner as the experimental example 11, the inside of the groove portion of the base body is filled with a conductor.

In addition, in the same manner as the experimental example 1, the filling rate of the groove portion is examined. The result is shown in Table 2.

Experimental Example 18

Except that Cu is embedded in a groove portion by forming a seed layer made of Cu with a thickness of 40 nm, heating a base body having the seed layer formed thereon to 300° C., and melting the seed layer, in the same manner as the experimental example 11, the inside of the groove portion of the base body is filled with a conductor.

In addition, in the same manner as the experimental example 1, the filling rate of the groove portion is examined. The result is shown in Table 2.

Experimental Example 19

Except that Cu is embedded in a groove portion by forming a seed layer made of Cu with a thickness of 45 nm, heating a base body having the seed layer formed thereon to 300° C., and melting the seed layer, in the same manner as the experimental example 11, the inside of the groove portion of the base body is filled with a conductor.

In addition, in the same manner as the experimental example 1, the filling rate of the groove portion is examined. The result is shown in Table 2.

Experimental Example 20

Except that Cu is embedded in a groove portion by heating a base body having a seed layer formed thereon to 250° C., and melting the seed layer, in the same manner as the experimental example 11, the inside of the groove portion of the base body is filled with a conductor.

In addition, in the same manner as the experimental example 1, the filling rate of the groove portion is examined. The result is shown in Table 2.

Experimental Example 21

Except that Cu is embedded in a groove portion by forming a seed layer made of Cu with a thickness of 35 nm, heating a base body having the seed layer formed thereon to 250° C., and melting the seed layer, in the same manner as the experimental example 11, the inside of the groove portion of the base body is filled with a conductor.

In addition, in the same manner as the experimental example 1, the filling rate of the groove portion is examined. The result is shown in Table 2.

Experimental Example 22

Except that Cu is embedded in a groove portion by forming a seed layer made of Cu with a thickness of 40 nm, heating a base body having the seed layer formed thereon to 250° C., and melting the seed layer, in the same manner as the experimental example 11, the inside of the groove portion of the base body is filled with a conductor.

In addition, in the same manner as the experimental example 1, the filling rate of the groove portion is examined. The result is shown in Table 2.

TABLE 1

| Melting temperature of seed layer (° C.) | Thickness of seed layer (nm) | | | |
|---|---|---|---|---|
| | 25 | 35 | 45 | 55 |
| 400 | X | X | Δ | — |
| 300 | X | Δ | Δ | Δ |
| 200 | X | X | X | — |

TABLE 2

| Melting temperature of seed layer (° C.) | Thickness of seed layer (nm) | | | | |
|---|---|---|---|---|---|
| | 15 | 25 | 35 | 45 | 55 |
| 400 | — | Δ | — | — | — |
| 350 | — | Δ | ○ | ○ | — |
| 300 | X | ○ | ○ | ○ | ○ |
| 250 | — | X | ○ | ○ | — |

As seen in the result of Table 1, when the thickness of a seed layer is equal to or more than 35 nm and the melting temperature of the seed layer is equal to or more than 300° C., the filling property of a conductive material (Cu) in a groove portion is found to be improved.

As seen in the result of Table 2, when the thickness of the seed layer is equal to or more than 35 nm and the melting temperature of the seed layer is equal to or more than 250° C. in a case where a seed layer formation process and a seed layer melting process are repeated twice, it is found that the groove portion can be fully filled with the conductive material (Cu).

REFERENCE SIGNS LIST

10 semiconductor device
11 base body
12 groove portion (trench)
13 barrier layer (barrier metal)
14 conductor (circuit wiring)
15 seed layer

What is claimed is:
1. A method of manufacturing a semiconductor device comprising:
a groove portion formation process of forming a groove portion in a base body;

a barrier layer formation process of forming a barrier layer covering at least the inner wall surface of the groove portion;

a seed layer formation process of forming a seed layer covering the barrier layer; and a seed layer melting process of causing the seed layer to be melted using a reflow method, wherein the seed layer is made of Cu, a thickness of the seed layer is equal to or more than 35 nm, and a melting temperature in the seed layer melting process is equal to or more than 250° C., and wherein the groove portion is filled by repeating the seed layer formation process and the seed layer melting process at least two more times.

2. The method of manufacturing a semiconductor device according to claim 1, wherein the barrier layer is made of a material including at least one of Ta, Ti, W, Ru, V, Co, and Nb.

3. The method of manufacturing a semiconductor device according to claim 1, wherein the base body is made of a semiconductor substrate and an insulating layer formed on one surface of the semiconductor substrate.

* * * * *